US012593410B2

(12) United States Patent
Chen et al.

(10) Patent No.: US 12,593,410 B2
(45) Date of Patent: Mar. 31, 2026

(54) OPENING METHOD AND OPENING DEVICE

(71) Applicant: SHENZHEN HAN'S CNC TECHNOLOGY CO., LTD., Shenzhen (CN)

(72) Inventors: Guodong Chen, Shenzhen (CN); Hongjie Lyu, Shenzhen (CN); Lisha Zhou, Shenzhen (CN); Xingsheng Huang, Shenzhen (CN); Zhaohui Yang, Shenzhen (CN)

(73) Assignee: SHENZHEN HAN'S CNC TECHNOLOGY CO., LTD., Shenzhen (CN)

( * ) Notice: Subject to any disclaimer, the term of this patent is extended or adjusted under 35 U.S.C. 154(b) by 630 days.

(21) Appl. No.: 17/926,149

(22) PCT Filed: Mar. 14, 2022

(86) PCT No.: PCT/CN2022/080556
§ 371 (c)(1),
(2) Date: Nov. 18, 2022

(87) PCT Pub. No.: WO2023/082511
PCT Pub. Date: May 19, 2023

(65) Prior Publication Data
US 2024/0237225 A1     Jul. 11, 2024

(30) Foreign Application Priority Data

Nov. 15, 2021     (CN) ......................... 202111347571.9

(51) Int. Cl.
H05K 3/22         (2006.01)
B23K 26/06        (2014.01)
(Continued)

(52) U.S. Cl.
CPC ........... *H05K 3/22* (2013.01); *B23K 26/0608* (2013.01); *B23K 26/384* (2015.10); (Continued)

(58) Field of Classification Search
CPC .. G02B 26/105; B23K 26/082; B23K 26/382; H05K 2203/107; H05K 2203/108; H05K 2203/1476; H05K 3/00
See application file for complete search history.

(56) References Cited

U.S. PATENT DOCUMENTS 8,729,426 B2 *   5/2014   Rumsby ............... B23K 26/066
                                                          216/13
9,346,122 B1 *   5/2016   Sukhman ........... B23K 26/0613
(Continued)

FOREIGN PATENT DOCUMENTS

CN          105228364 A        1/2016
CN          108650790 A   *  10/2018   ........... H05K 3/0044
(Continued)

OTHER PUBLICATIONS

Translation of CN-108650790-A (Year: 2018).*

*Primary Examiner* — Jeffrey T Carley

(57) ABSTRACT

An opening method and opening device are provided. The opening device can perform opening according to the following steps: controlling a first laser processing device to process an object to be opened to form a first opening area; controlling a second laser processing device to process the object to be opened to form a second opening area; the power of the first laser processing device is greater than that of the second laser processing device, and the light spot of the first laser processing device is larger than that of the second laser processing device. The second opening area surrounds the edge of the first opening area and connects to the first opening area.

9 Claims, 8 Drawing Sheets

(51) Int. Cl.

| | |
|---|---|
| _B23K 26/384_ | (2014.01) |
| _B23K 26/402_ | (2014.01) |
| _G02B 26/10_ | (2006.01) |
| _B23K 26/082_ | (2014.01) |
| _B23K 101/42_ | (2006.01) |

(52) U.S. Cl.

CPC .......... _B23K 26/402_ (2013.01); _G02B 26/105_ (2013.01); _B23K 26/082_ (2015.10); _B23K 2101/42_ (2018.08); _H05K 2203/107_ (2013.01)

(56) References Cited

U.S. PATENT DOCUMENTS

| | | | | |
|---|---|---|---|---|
| 2002/0040893 A1* | 4/2002 | Arai | ................... | B23K 26/0604 |
| | | | | 219/121.76 |
| 2002/0117067 A1 | 8/2002 | Fischer et al. | | |
| 2004/0084810 A1* | 5/2004 | Yung | ................... | H05K 3/4076 |
| | | | | 205/78 |
| 2004/0118824 A1* | 6/2004 | Burgess | ............... | B23K 26/282 |
| | | | | 29/852 |

| | | | | |
|---|---|---|---|---|
| 2008/0076267 A1* | 3/2008 | Oishi | ..................... | B23K 26/40 |
| | | | | 438/785 |
| 2008/0105303 A1* | 5/2008 | Oswald | ............... | B23K 26/082 |
| | | | | 257/E27.125 |
| 2008/0124816 A1 | 5/2008 | Bruland et al. | | |
| 2009/0114629 A1* | 5/2009 | Gross | ................... | B23K 26/067 |
| | | | | 219/121.77 |
| 2014/0096383 A1 | 4/2014 | Lee et al. | | |
| 2015/0017784 A1* | 1/2015 | Kim | ....................... | B23K 26/38 |
| | | | | 219/121.75 |
| 2018/0333918 A1* | 11/2018 | Sohn | .................... | B23K 26/127 |
| 2022/0088704 A1* | 3/2022 | Moruzzi | ............. | B23K 26/362 |

FOREIGN PATENT DOCUMENTS

| | | | | |
|---|---|---|---|---|
| CN | 110026678 A | 7/2019 | | |
| CN | 110719696 A | 1/2020 | | |
| CN | 112045323 A | 12/2020 | | |
| CN | 112384323 A | 2/2021 | | |
| CN | 113369719 A | 9/2021 | | |
| CN | 113543526 A | 10/2021 | | |
| EP | 1386689 A1 * | 2/2004 | ............. | B23K 26/40 |

* cited by examiner

OPENING METHOD AND OPENING DEVICE

This application claims the priority of the Chinese patent application with the application number CN202111347571.9 and the application title "Opening Method and Opening Device", which was submitted to the China Patent Office on Nov. 15, 2021, the entire contents of which are incorporated herein by reference.

TECHNICAL FIELD

The application belongs to the technical field of circuit board production, and in particular relates to an opening method and an opening device.

BACKGROUND

During the production process of the circuit board, it is necessary to open corresponding openings on the solder resist layer (solder mask layer) of the circuit board, so that the pads of the circuit board are exposed from the openings. The solder resist layer is usually an oil layer, such as a green oil layer or a white oil layer.

At present, the openings are mainly opened on the solder resist layer of the circuit board through processes such as exposure and development. This method is inefficient, and the circuit board needs to be immersed and etched with chemical potions during development, which easily leads to environmental pollution.

SUMMARY

According to various embodiments of the present application, an opening method and an opening device are provided.

An opening method may include following steps:

controlling a first laser processing apparatus to process an object to be opened so as to form a first opening area on the object to be opened;

controlling a second laser processing apparatus to process the object to be opened so as to form a second opening area on the object to be opened; and wherein a power of the first laser processing apparatus is greater than a power of the second laser processing apparatus, a light spot of the first laser processing apparatus is larger than a light spot of the second laser processing apparatus, and the second opening area surrounds at an edge of the first opening area and connects to the first opening area.

An opening device may include:

a first laser processing apparatus and a second laser processing apparatus;

the first laser processing apparatus used for processing a first processing area of an object to be opened so as to form a first opening area on the object to be opened; the second laser processing apparatus used for processing a second processing area of the object to be opened so as to form a second opening area on the object to be opened; and wherein a power of the first laser processing apparatus is greater than a power of the second laser processing apparatus, a light spot of the first laser processing apparatus is larger than a light spot of the second laser processing apparatus, and the second opening area surrounds at an edge of the first opening area and connects to the first opening area.

The details of one or more embodiments of the present application are set forth in the accompanying drawings and the description below. Other features and advantages of the present application will be apparent from the specification, drawings, and claims.

BRIEF DESCRIPTION OF THE DRAWINGS

In order to illustrate the technical solutions of the embodiments of the present application more clearly, the following briefly introduces the drawings that are used in the description of the embodiments of the present application. Obviously, the drawings in the following description are only some embodiments of the present application. For those of ordinary skill in the art, other drawings can also be obtained from these drawings without creative labour. The present application will be further described below with reference to the accompanying drawings and embodiments.

Among them, the reference signs in the specification are as follows:

100—Opening device;
101—First galvanometer system; 102—First non-telecentric focusing mirror;
200—Circuit board; 201—Area to be opened;
10—First laser processing apparatus; 20—Second laser processing apparatus;
30—Controlling apparatus;
A1—First processing area; A2—Second processing area; A21—First sub-processing area; A22—Second sub-processing area.

DETAILED DESCRIPTION

In order to make the technical problems solved by the present application, technical solutions and beneficial effects of the present application clearer, the present application will be further described in detail below with reference to the accompanying drawings and embodiments. It should be understood that the specific embodiments described herein are only used to explain the present application, but not to limit the present application.

In one application scenario, the inventor found that the existing opening for the solder resist layer on the circuit board is mainly realized by processes such as exposure or development. This method is not only inefficient, but also requires that the circuit board be immersed and etched with chemical potions during development, which easily leads to environmental pollution. In order to solve the above-mentioned technical problems, the inventive concept of the present application is developed, which will be specifically described by the following embodiments.

Figure 1:
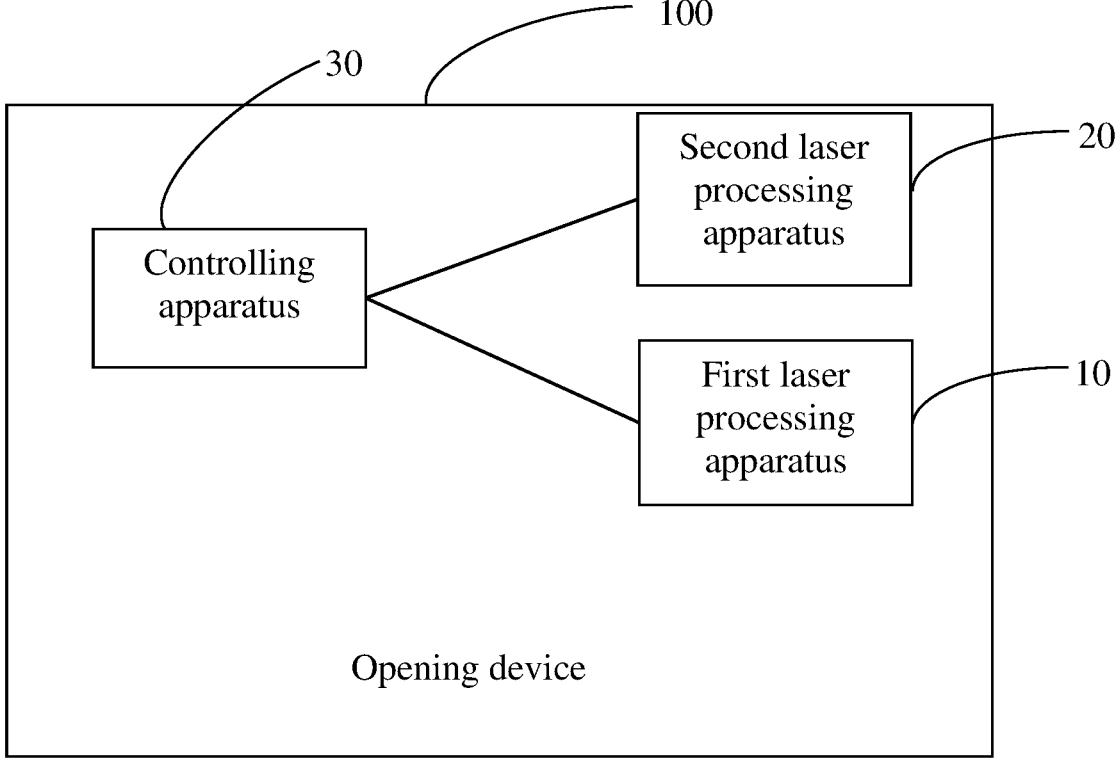
FIG. 1 is a schematic diagram of a module of an opening device provided by an embodiment of the present application.

As shown in FIG. 1, in one embodiment, an opening device 100 may be used to open an object to be opened, and the object to be opened may be a solder resist layer on a circuit board 200. The area to be opened 201 of the solder resist layer on the circuit board 200 is processed through the opening device 100 to form corresponding openings on the solder resist layer, so that the pads of the circuit board 200 are exposed from the opened openings to achieve the opening of the solder resist layer. Specifically, in the following embodiments, the function of the opening device 100 is introduced mainly by taking the object to be opened as the solder resist layer of the circuit board 200 as an example.

Figure 2:
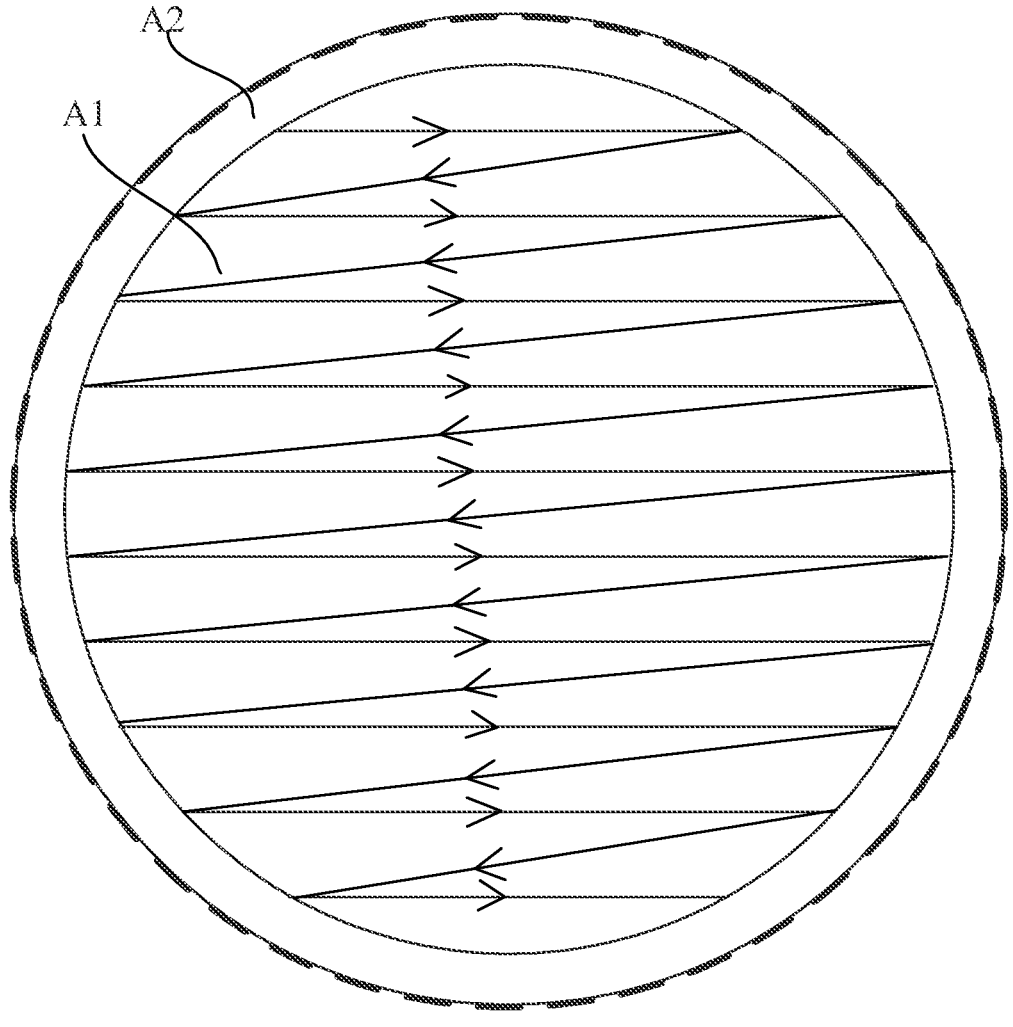
FIG. 2 is a schematic diagram of a processing path of a first laser processing apparatus of an opening device provided by an embodiment of the present application.
Figure 3:
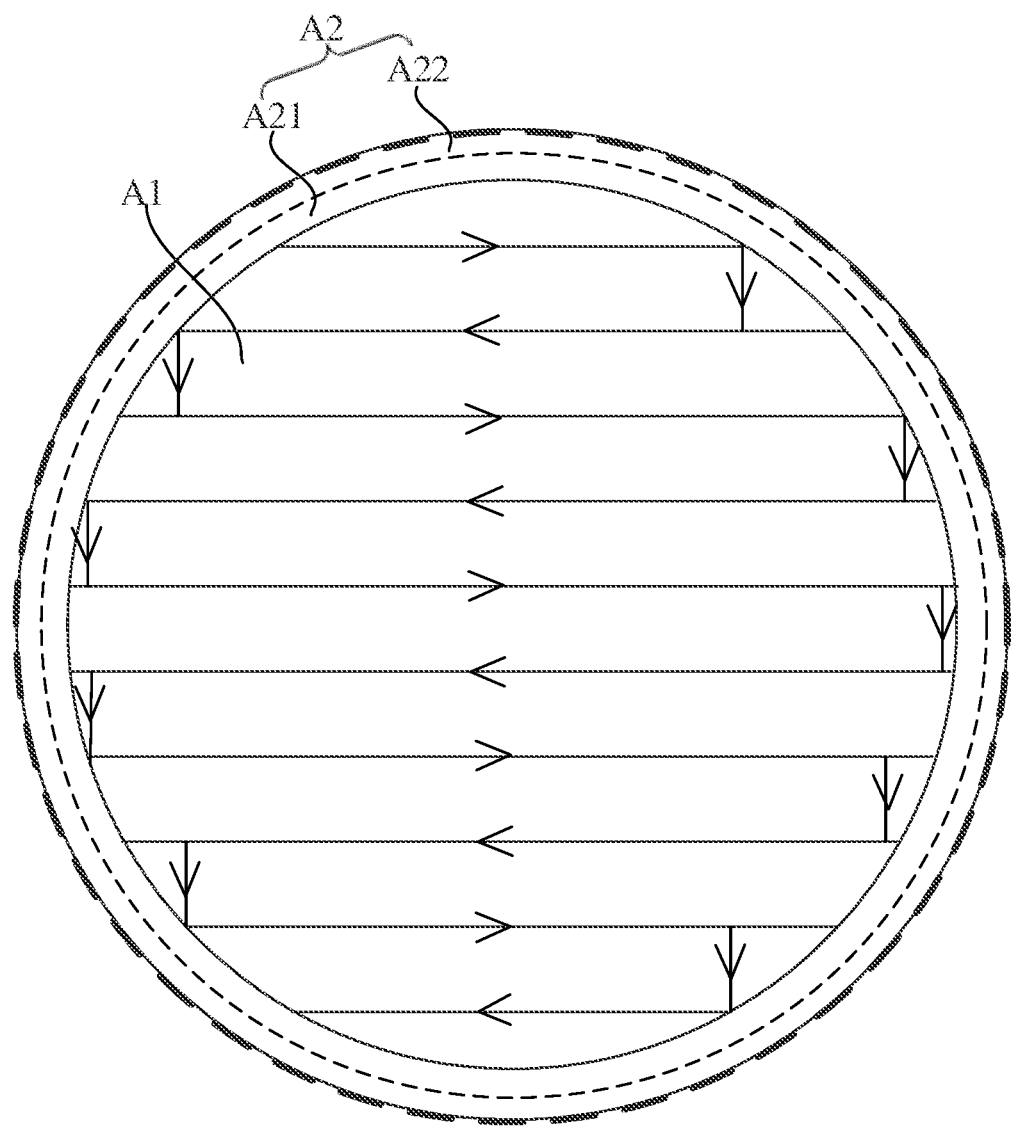
FIG. 3 is a schematic diagram of a processing path of a first laser processing apparatus of an opening device provided by another embodiment of the present application.

As shown in FIGS. 1 to 3, in one embodiment, the opening device 100 includes a first laser processing apparatus 10 and a second laser processing apparatus 20, the power of the first laser processing apparatus 10 is greater than the power of the second laser processing apparatus 20, and the light spot of the first laser processing apparatus 10 is larger than the light spot of the second laser processing apparatus 20. The power of the first laser processing apparatus can be configured to be 50 W-500 W; the power of the second laser processing apparatus can be configured to be 5 W-50 W; the light spot of the first laser processing apparatus 10 can be set to 30 μm-3 mm; and the light spot of the second laser processing apparatus 20 can be set to 5 μm-50 μm. In actual application scenarios, the configuration can be selected according to the situation, which is not limited here.

During operation, the first laser processing apparatus 10 is used to process the first processing area A1 of the solder resist layer to form a first opening area on the solder resist layer; and the second laser processing apparatus 20 is used to process the second processing area A2 of the solder resist layer to form a second opening area on the solder resist layer. The second processing area A2 surrounds the outer edge of the first processing area A1. After being processed, the second opening area surrounds the outer edge of the first opening area, and the second opening area connects to the first opening area. In addition, the first processing area A1 and the second processing area A2 constitute the area to be opened 201 of the solder resist layer. After being processed, the first opening area and the second opening area are connected to form openings, and the pads of the circuit board 200 are exposed from the openings. In addition, when the first laser processing apparatus 10 is processing, the solder resist layer in the first processing area A1 is completely removed by ablation of the first laser to form the first opening area, and when the second laser processing apparatus 20 is processing, the solder resist layer in the second processing area A2 is completely removed by ablation of the second laser to form the second opening area.

In the above embodiment, the solder resist layer is opened by laser processing, which is not only convenient to control, but also has high flexibility, and can realize the processing of openings of any shape. Moreover, by using the opening method of laser processing, compared with the traditional opening method using chemical potions, since chemical potions are not required, the opening method can be more environmentally friendly. At the same time, the waste generated by laser processing is a granular object, which is not only easy to collect, but also more environmentally friendly than the traditional method which produces inorganic substances due to the immersing and dissolving. Furthermore, the high-power and large-light spot processing apparatus and the low-power and small-light spot processing apparatus are respectively used to realize the opening of the object to be opened, which can not only speed up the opening operation of the solder resist layer, but also avoid the carbonization of the solder resist layer near the opening formed by the processing, so that the advantages of the two can be maximized.

In one embodiment, the first laser processing apparatus 10 may be a carbon dioxide laser processing apparatus, the second laser processing apparatus 20 may be an ultrafast laser processing apparatus, and the ultrafast laser processing apparatus may be anyone of a picosecond laser processing apparatus, a femtosecond laser processing apparatus and an attosecond laser processing apparatus. Further description will be given in conjunction with the above-mentioned embodiments. In practical application scenarios, since the first laser processing apparatus 10 may be a carbon dioxide laser processing apparatus which has the characteristics of high power and large processing light spot, the processing speed of the first laser processing apparatus 10 is relatively faster, but the processing temperature of the first laser processing apparatus 10 is relatively higher. After the processing of the first laser processing apparatus 10, the solder resist layer around the first opening area will be carbonized. If being not cleaned in time, in the subsequent use of the circuit board 200, the solder resist layer in these carbonized areas is likely to fall off, which will adversely affect the components on the circuit board 200 or around the circuit board 200. Therefore, the opening device 100 of the above-mentioned embodiment is further provided with a second laser processing apparatus 20 such as an ultrafast laser processing apparatus to process the outer edge of the first opening area to remove these carbonized solder resist layers. Since the second laser processing apparatus 20 such as the ultrafast laser processing apparatus has the characteristics of low power and small light spot, when the second laser processing apparatus 20 processes the solder resist layer, the thermal radiation effect generated by the second laser processing apparatus 20 is basically negligible and will not carbonize the solder resist layer around its processing area. In this way, the solder resist layer can be opened respectively by a high-power laser processing apparatus with a large light spot and a low-power laser processing apparatus with a small light spot. That is, by using the first laser processing apparatus 10 and the second laser processing apparatus 20 in combination, it can not only speed up the opening operation of the solder resist layer, but also avoid the carbonization of the solder resist layer near the openings formed by the processing, so that the advantages of the two can be maximized to further improve the opening efficiency of the solder resist layer and thus improve the production efficiency in practical applications.

In addition, the opening device 100 also has a corresponding controlling apparatus 30, and the controlling apparatus 30 can control the operation of the first laser processing apparatus 10 and the second laser processing apparatus 20.

The second opening area A2 may be a closed-loop structure, or the second opening area A2 may also be an open-loop structure.

In an actual product, the circuit board 200 usually has a plurality of pads, and these pads need to be exposed during use. Therefore, it is necessary to perform opening at positions, on the solder resist layer, corresponding to each pad. In addition, it is known that the areas on the solder resist need to be opened to expose the pads. During processing, the controlling apparatus 30 can control the first laser processing apparatus 10 and the second laser processing apparatus 20 accordingly, so that the laser emitted by the two can be accurately irradiated on the positions of the solder resist layer corresponding to the pads.

Figure 4:
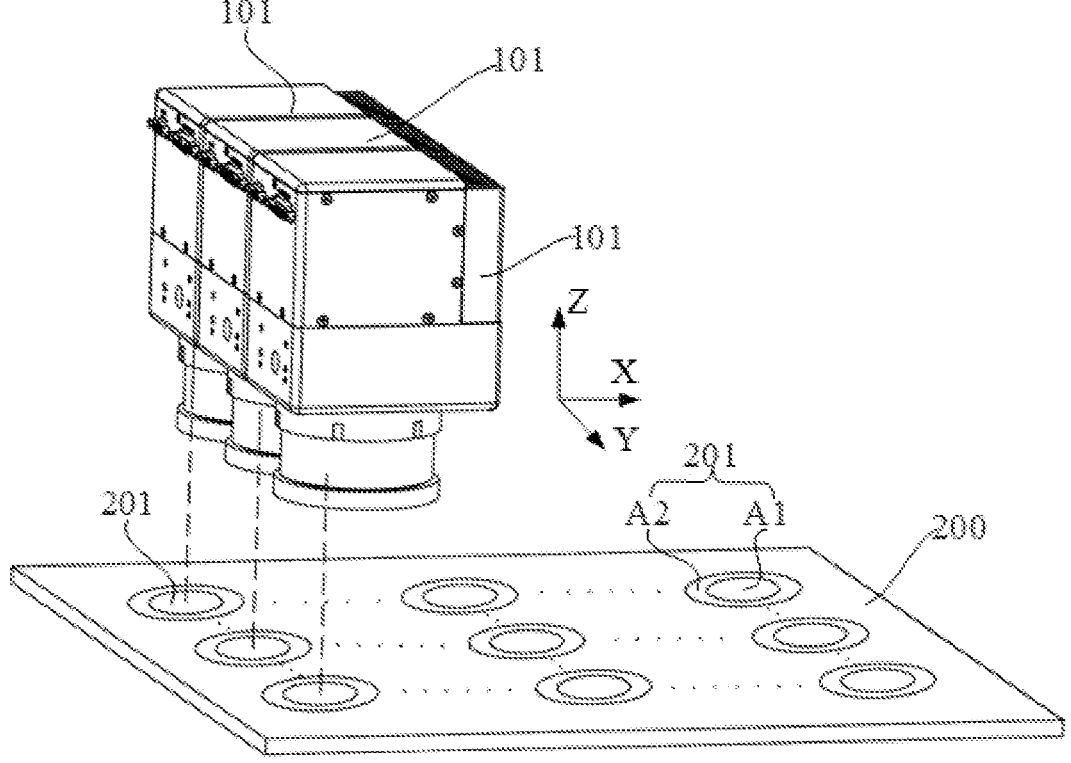
FIG. 4 is a schematic diagram 1 of the arrangement of a first galvanometer system of an opening device provided by an embodiment of the present application.
Figure 5:
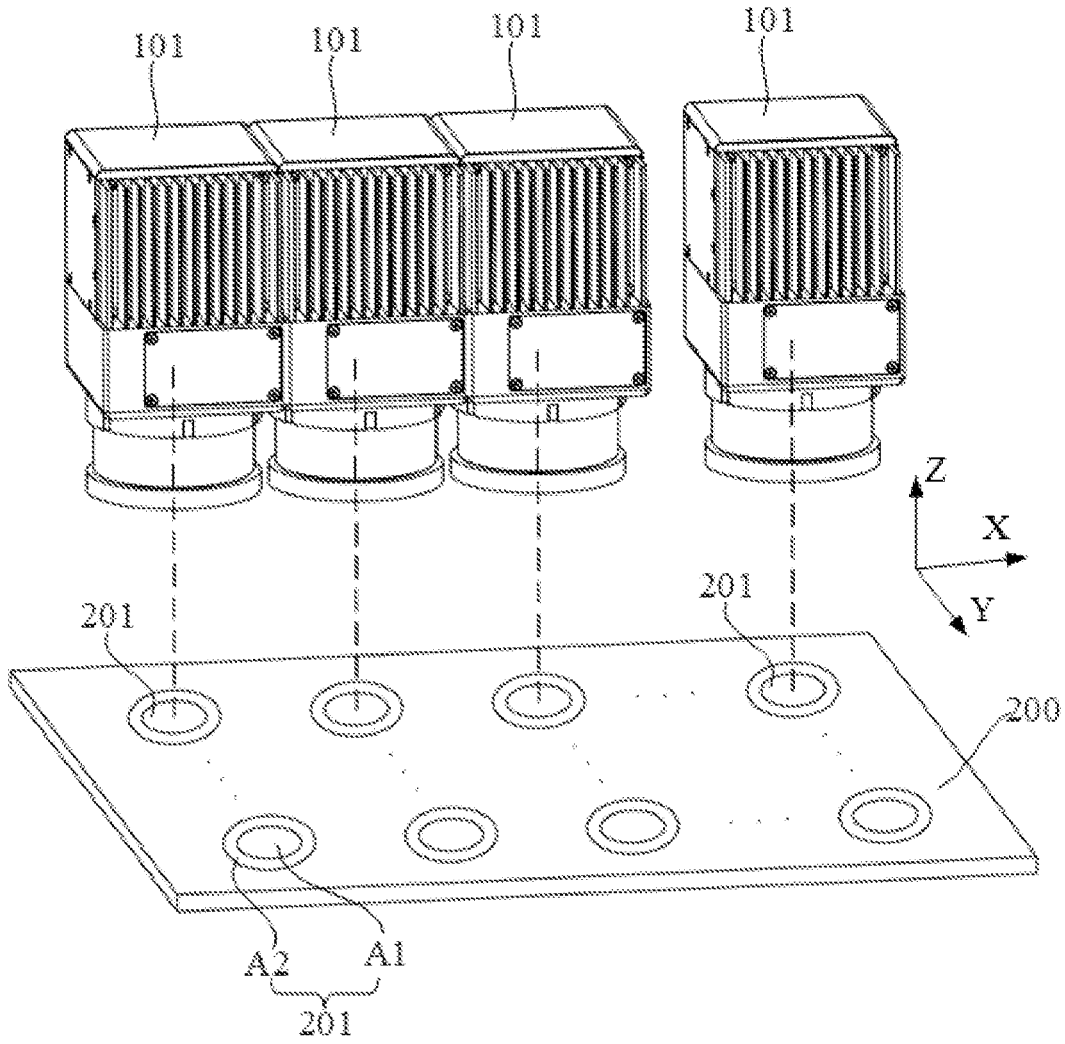
FIG. 5 is a schematic diagram 2 of the arrangement of a first galvanometer system of an opening device provided by an embodiment of the present application.

As shown in FIG. 4 and FIG. 5, in an embodiment, in order to improve production efficiency, the first laser processing apparatus 10 is provided with a first laser transmitter, a plurality of first galvanometer systems 101 and a first driving unit (not shown in the drawings). The first laser transmitter can emit a laser with high power and large light spot, and these first galvanometer systems 101 are used to transmit the laser emitted by the first laser transmitter to a plurality of first processing areas A1, so that the first laser processing apparatus 10 simultaneously perform a processing on the plurality of first processing areas A1 to form a plurality of first opening areas on the solder resist layer.

Specifically, the plurality of pads on the circuit board 200 can be divided into a plurality of groups, each pad group includes a plurality of pads arranged at intervals along a first direction, and the plurality of pad groups are arranged at intervals along a second direction. The number of pads in each pad group can be the same. In this case, the solder resist layer has a plurality of first processing area groups, and each first processing area group has a plurality of first processing area A1 arranged at intervals along the first direction, and the plurality of first processing area groups are arranged at intervals along the second direction. Each first processing area A1 covers a corresponding pad. In addition, the first direction is perpendicular to the second direction, and both the first direction and the second direction are parallel to the breadth of the solder resist layer during processing.

At this time, the first galvanometer systems 101 are arranged on the first driving unit at intervals along the first direction, and the first driving unit is used to drive the first laser transmitter and the first galvanometer systems 101 to move along the second direction. The number of the first processing areas A1 in each first processing area group is equal to the number of the first galvanometer systems 101, so that the first laser processing apparatus 10 can simultaneously process the first processing areas A1 in each first processing area group at each time to obtain a first opening area group. After the processing of one first processing area group is completed, through the corresponding control of the controlling apparatus 30, the first driving unit drives each first galvanometer system 101 to move along the second direction to the next first processing area group for processing.

In addition, during processing, the first galvanometer systems 101 are located above the solder resist layer. At this time, it is defined that the first galvanometer systems 101 and the solder resist layer are arranged along the Z-axis direction. Therefore, one of the first and second directions may be the X-axis direction, and the other of the first and second directions may be the Y-axis direction. In an actual application scenario, specifically, as shown in FIG. 4, at this time, the first direction can be set as the Y direction, and the second direction can be set as the X direction; or as shown in FIG. 5, the first direction may be the X direction, and the second direction may be the Y direction.

Similarly, in one embodiment, the second laser processing apparatus 20 includes a second laser transmitter, a plurality of second galvanometer systems, and a second driving unit. The second laser transmitter is used to emit a low-power laser with a small light spot. The plurality of second galvanometer systems are used to transmit the laser emitted by the second laser emitter to the plurality of second processing areas A2, so that the second laser processing apparatus 20 can simultaneously process the plurality of second processing areas A2. When the solder resist layer has a plurality of first processing area groups A1 arranged at intervals in the second direction, the solder resist layer also has a plurality of second processing area groups arranged at intervals along the second direction, each second processing area group has a plurality of second processing areas A2 arranged at intervals along the first direction, and each second processing area A2 surrounds the outer edge of one first processing area A1 correspondingly. At this time, the number of the second processing areas A2 in each second processing area group is equal to the number of the second galvanometer systems, so that the second laser processing apparatus 20 can simultaneously process the second processing areas A2 in each second processing area group at each time to obtain a second opening area group. After the processing of one second processing area group is completed, through the corresponding control of the controlling apparatus 30, the second driving unit drives each second galvanometer system to move along the second direction to the next second processing area group for processing.

In the above-mentioned embodiment, a plurality of galvanometer systems are correspondingly arranged at intervals in a certain direction (for example, the X direction), so that after a corresponding area of the area to be opened is processed through the plurality of galvanometer systems in the certain direction, the driving unit moves the plurality of galvanometer systems along a direction perpendicular to the certain direction (such as the Y direction) to the next area of the area to be opened for processing, which can reduce the movement time in a certain direction and further improve the opening efficiency of the area to be opened.

Figure 6:
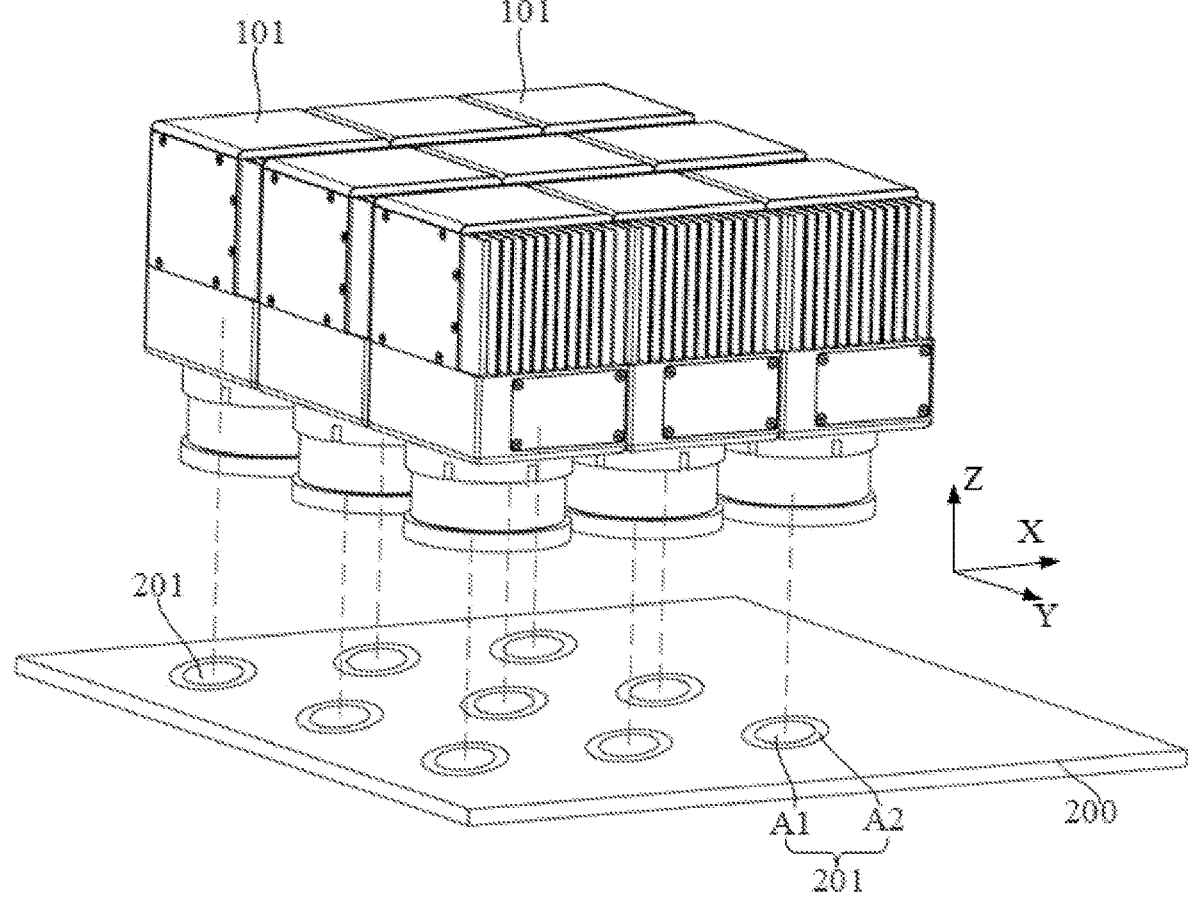
FIG. 6 is a schematic diagram 3 of the arrangement of a first galvanometer system of an opening device provided by an embodiment of the present application.

In the above embodiment, the corresponding settings in the opening device 100 can also be replaced with other methods. For example, as shown in FIG. 6, in another embodiment, the first laser processing apparatus 10 includes a first laser transmitter and a plurality of first galvanometer systems 101; the plurality of first galvanometer systems 101 are used to transmit the laser emitted by the first laser transmitter to the plurality of first processing areas A1, so that the first laser processing apparatus 10 can simultaneously process the plurality of first processing areas A1. Each first galvanometer system 101 corresponds to one of the first processing areas A1 (that is, a first galvanometer system 101 transmits the light emitted by the first laser emitter to a first processing area A1), and the number of the first galvanometer systems 101 is equal to the number of first processing areas A1 on one breadth of the solder resist layer (the breadth is parallel to the X axis and the Y axis), so that the first laser processing apparatus 10 can process all the first processing areas on one solder resist layer of the circuit board 200 at one time.

At this time, in order for the second laser processing apparatus 20 to process all the second processing areas A2 on one solder resist layer of the circuit board 200 at one time, the second laser processing apparatus 20 includes a second laser transmitter and a plurality of second galvanometer systems, the plurality of second galvanometer systems are used to transmit the laser emitted by the second laser emitters to the plurality of second processing areas A2, so that the second laser processing apparatus 20 can simultaneously process the plurality of second processing areas A2. Each second galvanometer system corresponds to one of the second processing areas A2 (that is, a second galvanometer system transmits the light emitted by the second laser emitter to a second processing area A2), and the number of the second galvanometer systems is equal to the number of the second processing areas A2 on one breadth of the solder resist layer.

For another example, in another embodiment, the first laser processing apparatus 10 and the second laser processing apparatus 20 may only perform an opening operation at one pad at a time. Through the corresponding driving devices, the first laser processing apparatus 10 and the second laser processing apparatus 20 are driven to move to the next pad to perform the opening operation after the opening of a pad is completed.

In addition, in an embodiment, the light emitted by each first galvanometer system 101 can cover one breadth of the entire processing table (this breadth is defined as a support surface), the support surface is parallel to the X axis and the Y axis, and the support surface is used to place circuit boards of different sizes. In the actual scene, the length and width of the circuit board are usually smaller than the length and width of the support surface used to support and place the circuit board. At this time, the laser emitted from each first galvanometer system 101 can also completely cover the solder resist layer of the circuit board placed on the support surface. That is, through this arrangement, not only can the first laser processing apparatus 10 process all the first processing areas of the solder resist layer at the same time, but also the first laser processing apparatus 10 can be adapted to circuit boards of different sizes and the first processing areas with different arrangements. Similarly, the light emitted by each second galvanometer system can also cover the above-mentioned support surface of the processing table, so that the light emitted by the second galvanometer system can completely cover the solder resist layer of the circuit board placed on the support surface. In this way, not only can the second laser processing apparatus 20 process all the second processing areas of the solder resist layer at the same time, but also the second laser processing apparatus 20 can be adapted to circuit boards of different sizes and the second processing areas with different arrangements. This can further improve the flexibility and applicability of practical applications.

Figure 7:
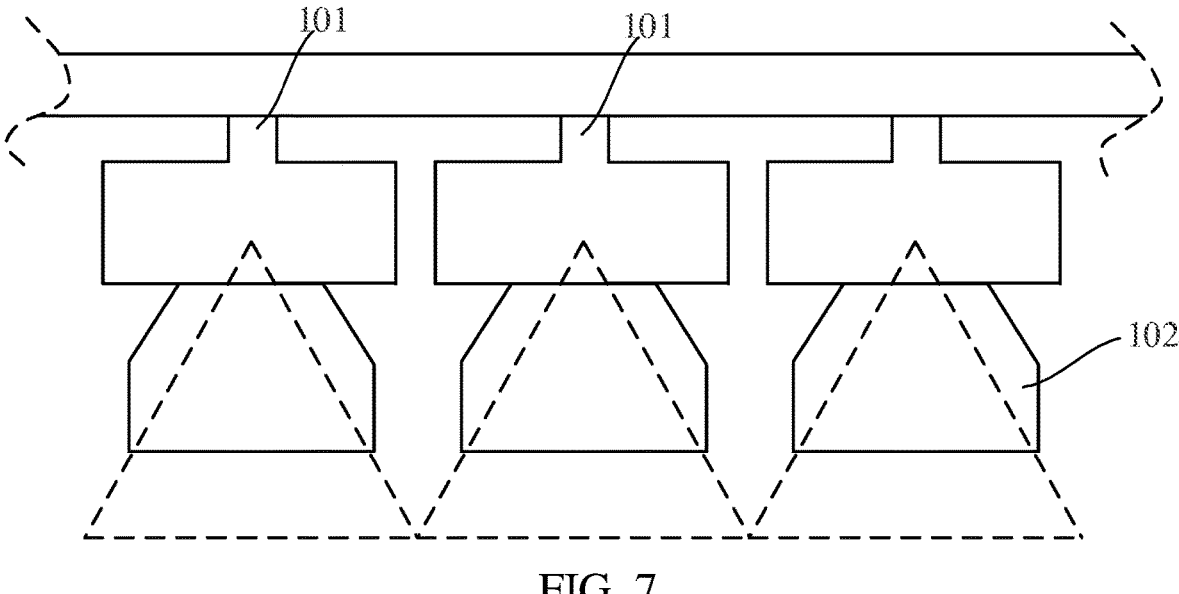
FIG. 7 is a schematic diagram 4 of the arrangement of a first galvanometer system of an opening device provided by an embodiment of the present application.

Based on the plurality of galvanometer systems provided in the foregoing embodiments, further, as shown in FIG. 7, in the foregoing embodiments, the first galvanometer system 101 may include a first non-telecentric focusing mirror 102, the first non-telecentric focusing mirror 102 is used to project the laser emitted by the first laser transmitter to the first processing area A1. It can be understood that, by configuring the first non-telecentric focusing mirror 102 in the first galvanometer system 101, the projection range of the light emitted from the first galvanometer system 101 can be increased, and through the first non-telecentric focusing mirror 102, full covering of the laser to the first processing area A1 can be realized, and the plurality of galvanometer systems configured in this way can realize full covering of the circuit board to be processed or even the entire support surface, so that the processing speed of the first laser processing apparatus 10 can be further improved. It can be understood that the first galvanometer system 101 also includes corresponding mirrors and other components, and these components and their corresponding connection relationships may all adopt existing designs. In addition, the first non-telecentric focusing mirror 102 can be arranged at the extreme end of a galvanometer system 101, when light is emitted from the first non-telecentric focusing mirror 102, it means that the light is emitted from the entire first galvanometer system 101.

Similarly, the second galvanometer system includes a second non-telecentric focusing mirror, the second non-telecentric focusing mirror is used to project the laser emitted by the second laser emitter to the second processing area A2, and the second non-telecentric focusing mirror can increase the projection range of the light emitted from the second galvanometer, which can improve the processing speed of the second laser processing apparatus 20. In addition, the setting method of the second galvanometer system can be the same as that of the first galvanometer system 101, which can reduce the production cost of the opening device 100. In order to avoid redundancy, the description in detail is not described here.

In addition, it is particularly noted that since the above-mentioned first galvanometer system and second galvanometer system both use non-telecentric focusing mirrors, the splicing of the processing breadth and even the processing table can be realized through the non-telecentric focusing mirrors, so that the coverage of the laser processing is wider, and in the actual product, there can be a certain distance between adjacent galvanometer systems to facilitate the heat dissipation between the galvanometer systems, thereby making the performance of the opening device 100 more stable and reliable, and improving the service life of the opening device 100.

Figure 8:
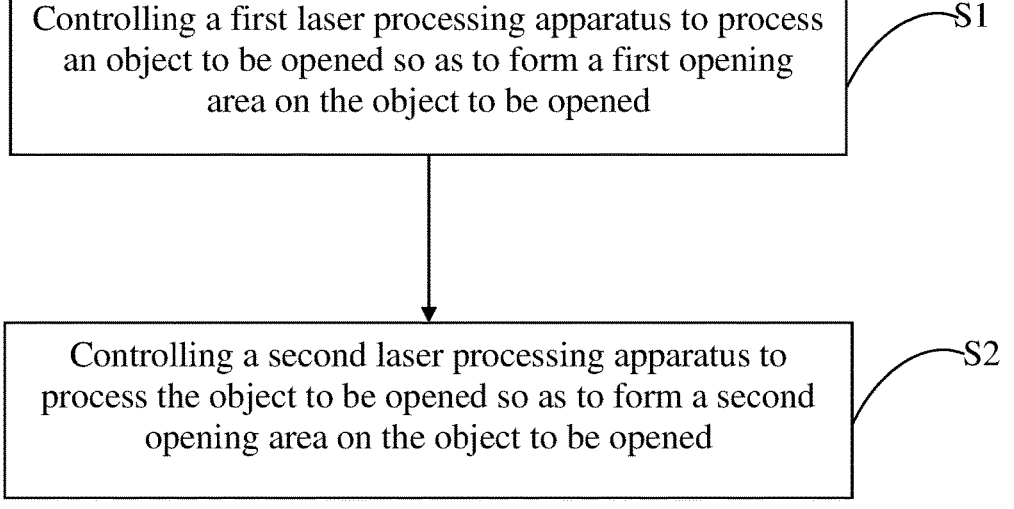
FIG. 8 is a schematic flowchart of an opening method of an opening device provided by an embodiment of the present application.

As shown in FIG. 8, an embodiment of the present application further provides an opening method for performing opening on an object to be opened. The opening method can be implemented based on the opening device 100 described in the above embodiments, the opening method may specifically include the following steps:

Step S1, controlling the first laser processing apparatus 10 to process the object to be opened, so as to form a first opening area on the object to be opened;

Step S2, controlling the second laser processing apparatus 20 to process the object to be opened, so as to form a second opening area on the object to be opened; the second opening area surrounds the edge of the first opening area, and connects to the first opening area. In one embodiment, the object to be opened is a solder resist layer on the circuit board 200, and the arrangement of the first opening area and the second opening area may expose the pads of the circuit board 200.

In the actual production process, the operation of step S1 may be performed first, and then the operation of step S2 may be performed. At this time, the operation of step S2 may be performed from the edge of the first opening area. In addition, in the above-mentioned opening method, the controlling of the first laser processing apparatus 10 and the second laser processing apparatus 20 may be realized by the controlling apparatus 30 of the opening device 100 itself. Of course, in some embodiments, corresponding controlling apparatuses 30 independent of the opening device 100 may also be used to control the operations of the first laser processing apparatus 10 and the second laser processing apparatus 20. There is no specific limitation here, and selection can be made according to actual scenarios.

In addition, in actual production, the second opening area may surround the outer edge of the first opening area. In one embodiment, when the first opening area is an annular structure, the second opening area may also surround the inner edge of the first opening area, or the second opening area may simultaneously surround the inner and outer edges of the first opening area.

Figure 9:
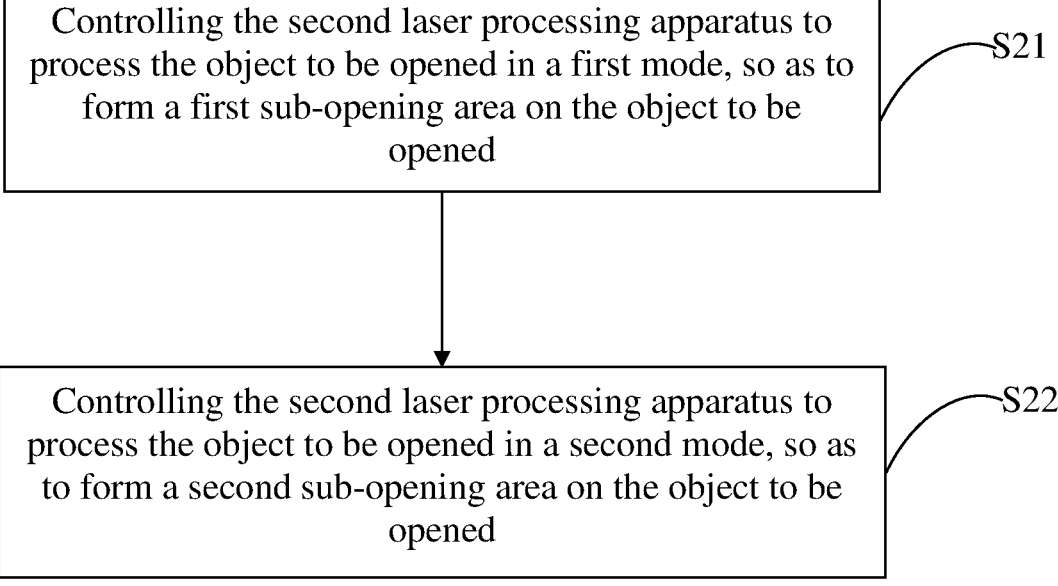
FIG. 9 is a schematic flowchart of the processing of a second opening area of an opening device provided by an embodiment of the present application.

As shown in FIG. 9, in an embodiment, step S2 may further include:

Step S21, controlling the second laser processing apparatus 20 to process the object to be opened in a first mode, so as to form a first sub-opening area on the object to be opened.

Step S22, controlling the second laser processing apparatus 20 to process the object to be opened in the second mode, so as to form a second sub-opening area on the object to be opened. The first sub-opening area is located between the second sub-opening area and the first opening area, the second sub-opening area surrounds the edge of the first sub-opening area, and the second sub-opening area is connected to the first sub-opening area to form the above-mentioned second opening area. In addition, the power of the second laser processing apparatus 20 in the first mode is greater than the power of the second laser processing apparatus 20 in the second mode.

At this time, as shown in FIG. 3, it represents that along the arrangement direction of the first processing area A1 and the second processing area A2, the second processing area A2 has a first sub-processing area A21 and a second sub-processing area A22, the first sub-processing area A21 and the second sub-processing area A22 are both annular areas, the first sub-processing area A21 and the second sub-processing area A22 are adjacent, and the first sub-processing area A21 is located between the second sub-processing area A22 and the first processing area A1. When processing the first sub-processing area A21, the second laser processing apparatus 20 is in the first working mode, and the first sub-processing area A21 is processed to form a first sub-opening area; when processing the second sub-processing area A22, the second laser processing apparatus 20 is in the second working mode, and the second sub-processing area A22 is processed to form the second sub-opening area. Since the power in the second mode is relatively smaller, the adverse effects on the solder resist layer on the outer of the second processing area A2 can be further reduced under the condition of ensuring the processing speed.

It can be understood that, in some embodiments, in addition to the first sub-processing area A21 and the second sub-processing area A22, the second processing area A2 may also have a third sub-processing area, a fourth sub-processing area, and the like. That is, the second processing area A2 can be divided into three or more sub-processing areas from the inside to the outside along the radial direction. When processing each sub-processing area, the second laser processing apparatus 20 is in a working mode, and the power of the second laser processing apparatus 20 is gradually reduced when processing each sub-processing area in the direction from the inside to the outside.

In addition, in actual processing, the area of the first opening area is larger than the area of the second opening area, that is, the area of the first processing area A1 is larger than the area of the second processing area A2. At this time, the first processing area A1 is the main processing area. Since the first laser processing apparatus 10 can emit a large light spot with high power, the processing spacing is large, thereby improving the processing efficiency and shortening the processing time when processing a large area.

As shown in FIG. 2, in one embodiment, the above step S1 includes: controlling the first laser processing apparatus 10 to process the object to be opened along a Z-shaped path from the starting side to the ending side, so as to form a first opening area on the object to be opened. Of course, the first laser processing apparatus 10 can use other processing paths to process the object to be opened, for example, as shown in FIG. 3, in another embodiment, the above step S1 includes: controlling the first laser processing apparatus 10 to process the object to be opened along a ⊐-shaped path from the starting side to the ending side, so as to form a first opening area on the object to be opened.

In one embodiment, the above step S2 includes: controlling the second laser processing apparatus 20, along the edge of the first opening area, to process the object to be opened to an ending side according to an annular processing path, so as to form the second opening area on the object to be opened.

In the above-mentioned embodiment, it can be understood that the solder resist layer is opened by this laser processing method, which is not only convenient to control, but also has high flexibility, and can realize the processing of openings of any shape. Moreover, by using the opening method of laser processing, compared with the traditional opening process method using chemical potions, since chemical potions used in traditional applications are not required, the opening method can be more environmentally friendly. At the same time, the waste generated by laser processing is a granular object, which is not only easy to collect, but also more environmentally friendly than the traditional method which produces inorganic substances due to the immersing and dissolving. In addition, the high-power and large-light spot laser and the low-power and small-light spot laser are respectively used to realize the opening of the object to be opened. That is, through the combined use of the first laser processing and the second laser processing, the processing time of the main opening area can be shorten due to the large light spot and the large processing spacing of the first laser, which can speed up the opening operation of the solder resist layer, and at the same time, the edge of the main opening area can be processed by the second laser, which has fast processing speed on the edge, and can efficiently solve the problem of carbonization of the solder resist near the openings of the main opening area, thereby maximizing the advantages of the two, so as to further improve, for example, the opening efficiency of the solder resist layer to improve production efficiency in practical applications.

The technical features of the above-described embodiments can be combined arbitrarily. For the sake of brevity, all possible combinations of the technical features in the above-described embodiments are not described. However, as long as there is no contradiction between the combinations of these technical features, all possible combinations should be regarded as the scope described in this specification.

The above descriptions are only preferred embodiments of the present application and are not intended to limit the present application. Any modifications, equivalent replacements and improvements made within the spirit and principles of the present application shall be included in the scope of protection of the present application.

What is claied is:

1. An opening device, comprising:
a first laser processing apparatus and a second laser processing apparatus;

the first laser processing apparatus configured to process a first processing area of an object to be opened to form a first opening area on the object to be opened;

the second laser processing apparatus configured to process a second processing area of the object to be opened to form a second opening area on the object to be opened; and wherein a power of the first laser processing apparatus is greater than a power of the second laser processing apparatus, a light spot of the first laser processing apparatus is larger than a light spot of the second laser processing apparatus, and the second opening area surrounds at an edge of the first opening area and connects to the first opening area;

the first laser processing apparatus comprises a first laser transmitter, a plurality of first galvanometer systems and a first driving unit;

each of the plurality of first galvanometer systems is configured to transmit a laser emitted by the first laser transmitter to different areas of the object to be opened, so that the first laser processing apparatus simultaneously processes a plurality of first processing areas of the object to be opened; and each of the plurality of first galvanometer systems is arranged on the first driving unit at intervals along a first direction, and the first driving unit is configured to drive the first laser transmitter and each of the plurality of first galvanometer systems to move along a second direction.

2. The opening device of claim 1, wherein the second laser processing apparatus comprises a second laser transmitter, a plurality of second galvanometer systems and a second driving unit;

each of the plurality of second galvanometer systems is configured to transmit a laser emitted by the second laser transmitter to different areas of the object to be opened, so that the second laser processing apparatus simultaneously processes a plurality of second processing areas of the object to be opened; and each of the plurality of second galvanometer systems is arranged on the second driving unit at intervals along a first direction, and the second driving unit is configured to drive the second laser transmitter and each of the plurality of second galvanometer systems to move along a second direction.

3. The opening device of claim 1, wherein the second laser processing apparatus comprises a second laser transmitter and a plurality of second galvanometer systems;

the plurality of second galvanometer systems are configured to transmit a laser emitted by the second laser transmitter to a plurality of second processing areas, so that the second laser processing apparatus simultaneously perform a processing on the plurality of second processing areas; and wherein a number of the plurality of second galvanometer systems is equal to a number of the second processing areas on a breadth of the object to be opened, and a second galvanometer system corresponds to a second processing area.

4. The opening device of claim 1, wherein each first galvanometer system comprises a first non-telecentric focusing mirror for projecting the laser emitted by the first laser transmitter to a corresponding first processing area.

5. The opening device of claim 2, wherein each second galvanometer system comprises a second non-telecentric focusing mirror for projecting the laser emitted by the second laser transmitter to a corresponding second processing area.

6. The opening device of claim 1, wherein the first laser processing apparatus is a carbon dioxide laser processing apparatus, and the second laser processing apparatus is an ultrafast laser processing apparatus.

7. The opening device of claim 1, wherein the first direction is perpendicular to the second direction.

8. The opening device of claim 3, wherein each second galvanometer system comprises a second non-telecentric focusing mirror for projecting the laser emitted by the second laser transmitter to a corresponding second processing area.

9. The opening device of claim 2, wherein the first direction is perpendicular to the second direction.

* * * * *